(12) United States Patent
Huang

(10) Patent No.: US 7,564,727 B1
(45) Date of Patent: Jul. 21, 2009

(54) APPARATUS AND METHOD FOR CONFIGURABLE POWER MANAGEMENT

(75) Inventor: Jinsong Oliver Huang, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 77 days.

(21) Appl. No.: 11/821,811

(22) Filed: Jun. 25, 2007

(51) Int. Cl.
*G11C 16/06* (2006.01)
*G05F 12/02* (2006.01)

(52) U.S. Cl. ............ 365/195; 365/185.04; 365/185.05; 365/185.09; 711/2; 711/5; 711/114

(58) Field of Classification Search ............. 326/38–41; 713/320, 323, 324; 365/195, 185.04, 185.09; 711/2, 5, 114
See application file for complete search history.

(56) References Cited

U.S. PATENT DOCUMENTS 7,134,025 B1 * 11/2006 Trimberger ................. 713/189
2005/0259484 A1 * 11/2005 Newell ........................ 365/195
2006/0117156 A1 * 6/2006 Chai et al. ................... 711/163

OTHER PUBLICATIONS

Xilinx, Inc., "Spartan-3 Generation Configuration User Guide", Spartan™-3A, Spartan-3E, and Spartan 3 FPGA Families (with ISE 8.2.03i Design Examples), v1.0, Dec. 5, 2006, pp. 190, available from Xilinx, Inc., 2100 Logic Drive, San Jose, CA 95124.

* cited by examiner

*Primary Examiner*—Vibol Tan
(74) *Attorney, Agent, or Firm*—Michael T. Wallace; Michael R. Hardaway

(57) ABSTRACT

A method and apparatus to facilitate low-power consumption through a configurable suspend mode of operation of a PLD, the PLD comprising an application logic block coupled to receive configuration data bits and adapted to implement a logic application in response to the configuration data bits, a suspend pin coupled to receive a suspend signal, a write protect block coupled to the application logic block and adapted to prohibit the application logic block from changing logic states in response to a suspend mode initiated by the suspend signal; and an awake pin adapted to provide an awake signal that is indicative of a status of the suspend mode.

19 Claims, 4 Drawing Sheets

APPARATUS AND METHOD FOR CONFIGURABLE POWER MANAGEMENT

FIELD OF THE INVENTION

The present invention generally relates to programmable logic devices (PLDs), and more particularly to PLDs that provide configurable power management.

BACKGROUND OF THE INVENTION

PLDs are a well-known type of integrated circuit that may be programmed to perform specified logic functions. One type of PLD, the Field Programmable Gate Array (FPGA), typically includes an array of programmable tiles. These programmable tiles can include, for example, Input/Output Blocks (IOBs), Configurable Logic Blocks (CLBs), dedicated Random Access Memory Blocks (BRAM), multipliers, Digital Signal Processing blocks (DSPs), processors, clock managers, Delay Lock Loops (DLLs), Multi-Gigabit Transceivers (MGTs) and so forth.

Each programmable tile typically includes both programmable interconnect and programmable logic. The programmable interconnect typically includes a large number of interconnect lines of varying lengths interconnected by Programmable Interconnect Points (PIPs). The programmable logic implements the logic of a user design using programmable elements that may include, for example, function generators, registers, arithmetic logic, and so forth.

The programmable interconnect and the programmable logic are typically programmed by loading a stream of configuration data into internal configuration memory cells during a configuration event that defines how the programmable elements are configured. The configuration data may be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these PLDs, the functionality of the device is controlled by configuration data bits provided to the device for that purpose. The configuration data bits can be stored in volatile memory (e.g., static memory cells, as in FPGAs and some CPLDs), in non-volatile memory (e.g., FLASH memory, as in some CPLDs), or in any other type of memory cell.

Some PLDs, such as the Xilinx Virtex® FPGA, can be programmed to incorporate blocks with pre-designed functionalities, i.e., "cores". A core can include a predetermined set of configuration data bits that program the FPGA to perform one or more functions. Alternatively, a core can include source code or schematics that describe the logic and connectivity of a design. Typical cores can provide, but are not limited to, DSP functions, memories, storage elements, and math functions. Some cores include an optimally floor planned layout targeted to a specific family of FPGAs. Cores can also be parameterizable, i.e., allowing the user to enter parameters to activate or change certain core functionality.

Some FPGAs may also be configured to provide the lowest possible standby power, which minimizes the amount of power that is consumed during a low-power consumption mode. A conventional technique that may be used to minimize power during a low-power consumption mode is to invoke the so-called "hibernate" mode, whereby essentially all of the logic within the FPGA is disabled to save power. The hibernate mode, however, requires that the FPGA undergo a time consuming reconfiguration event before returning to normal operation. Furthermore, multiple FPGAs returning from the hibernate mode cannot be assured to obtain operational status simultaneously. As such, adverse affects may be imposed upon a system if synchronous wake-up operations are required. Efforts continue, therefore, to obtain significant reductions in the amount of power consumed during a low-power consumption mode, while also providing synchronous recovery in a reduced amount of time.

SUMMARY OF THE INVENTION

To overcome limitations in the prior art, and to overcome other limitations that will become apparent upon reading and understanding the present specification, various embodiments of the present invention disclose an apparatus and method for providing a suspend mode of operation, which provides low-power consumption while facilitating an accelerated wake-up process.

In accordance with one embodiment of the invention, a programmable logic device comprises an application logic block that is coupled to receive configuration data bits and is adapted to implement a logic application in response to the configuration data bits. The programmable logic device further comprises a suspend pin that is coupled to receive a suspend signal and a write protect block that is coupled to the application logic block and is adapted to prohibit the application logic block from changing logic states in response to a suspend mode initiated by the suspend signal. The programmable logic device further comprises an awake pin that is adapted to provide an awake signal that is indicative of a status of the suspend mode.

In accordance with another embodiment of the invention, a method of implementing configurable power management within an integrated circuit comprises configuring an application logic block within the integrated circuit to execute a logic application, activating a suspend mode within the integrated circuit, and suspending operation of the application logic block while the suspend mode is active. The configuration and application state of the application logic block being preserved during the suspend mode. The method further comprises configuring an output driver of the integrated circuit to allow deactivation of the suspend mode. Operation of the application logic block is resumed in response to the deactivated suspend mode without requiring a reconfiguration of the application logic block.

In accordance with another embodiment of the invention, a configurable power management system comprises a plurality of programmable logic devices that are coupled together at a first node. Each programmable logic device includes an application logic block that is coupled to receive configuration data bits and is adapted to implement a logic application in response to the configuration data bits. Each programmable logic device further includes a suspend-pin that is coupled to receive a suspend signal, a write protect block that is coupled to the application block and is adapted to prohibit the application block from changing logic states in response to a suspend mode initiated by the suspend signal. Each programmable logic device further includes an output driver that is coupled to receive an awake signal from within the programmable logic device, where an output of the output driver is disabled in response to the awake signal. Each programmable logic device further includes an awake pin that is coupled to the output of the output driver. The configurable power management system further comprises an external device that is coupled to the first node. The external device is adapted to assert a logic level at the first node to allow the plurality of programmable logic devices to synchronously recover from the suspend mode after each output driver of each programmable logic device is disabled.

BRIEF DESCRIPTION OF THE DRAWINGS

Various aspects and advantages of the invention will become apparent upon review of the following detailed description and upon reference to the drawings in which.

DETAILED DESCRIPTION OF THE DRAWINGS

Generally, various embodiments of the present invention are applied to the field of integrated circuits (ICs) of which programmable logic devices (PLDs) are a subset. In particular, a method and apparatus is provided to facilitate a suspend mode of operation that facilitates low-power consumption. The suspend mode may then be followed by a wake-up process, which facilitates synchronous recovery from the suspend mode in a reduced amount of time. The suspend mode allows one or more PLDs, e.g., field programmable gate arrays (FPGAs), to be placed into a substantially static condition that virtually eliminates active current flow within the FPGA(s). In addition, the suspend mode retains configuration data and the state of the FPGA application during the time that the suspend mode is active.

Recovery from the suspend mode occurs during a wake-up process that is initiated by an external source, whereby the logic voltage level of an external pin, e.g., the SUSPEND pin (201 in FIG. 2), is deasserted to a logic low level. In response, the FPGA initiates the wake-up process, whereby the FPGA may assert the logic level of another external pin, e.g., the AWAKE pin (203 in FIG. 2), by applying a logic high voltage level to the AWAKE pin. In one embodiment, an active output driver within the FPGA may assert the voltage of the AWAKE pin in response to receiving an awake signal during the wake-up process. In such an instance, external devices may monitor the status of the FPGA's suspend mode by sampling the logic voltage level of the AWAKE pin.

In an alternate embodiment, an open-drain output driver may instead be coupled to the AWAKE pin, whereby an external source may delay the wake-up process by holding the voltage level of the AWAKE pin to a logic low value. As such, once the awake signal is generated within the FPGA, the output of the open-drain output driver may be enabled, so as to allow an external source to either assert the AWAKE pin to a logic high value, or maintain the voltage of the AWAKE pin to a logic low value. Thus, by connecting the AWAKE pins of multiple FPGAs to an external source, the wake-up process may be synchronized across multiple FPGA devices. Whether an active output driver, or an open-drain output driver, is used, external devices may monitor the status of the suspend mode within one or more FPGAs by sampling the logic voltage level of the AWAKE pin.

Figure 1:
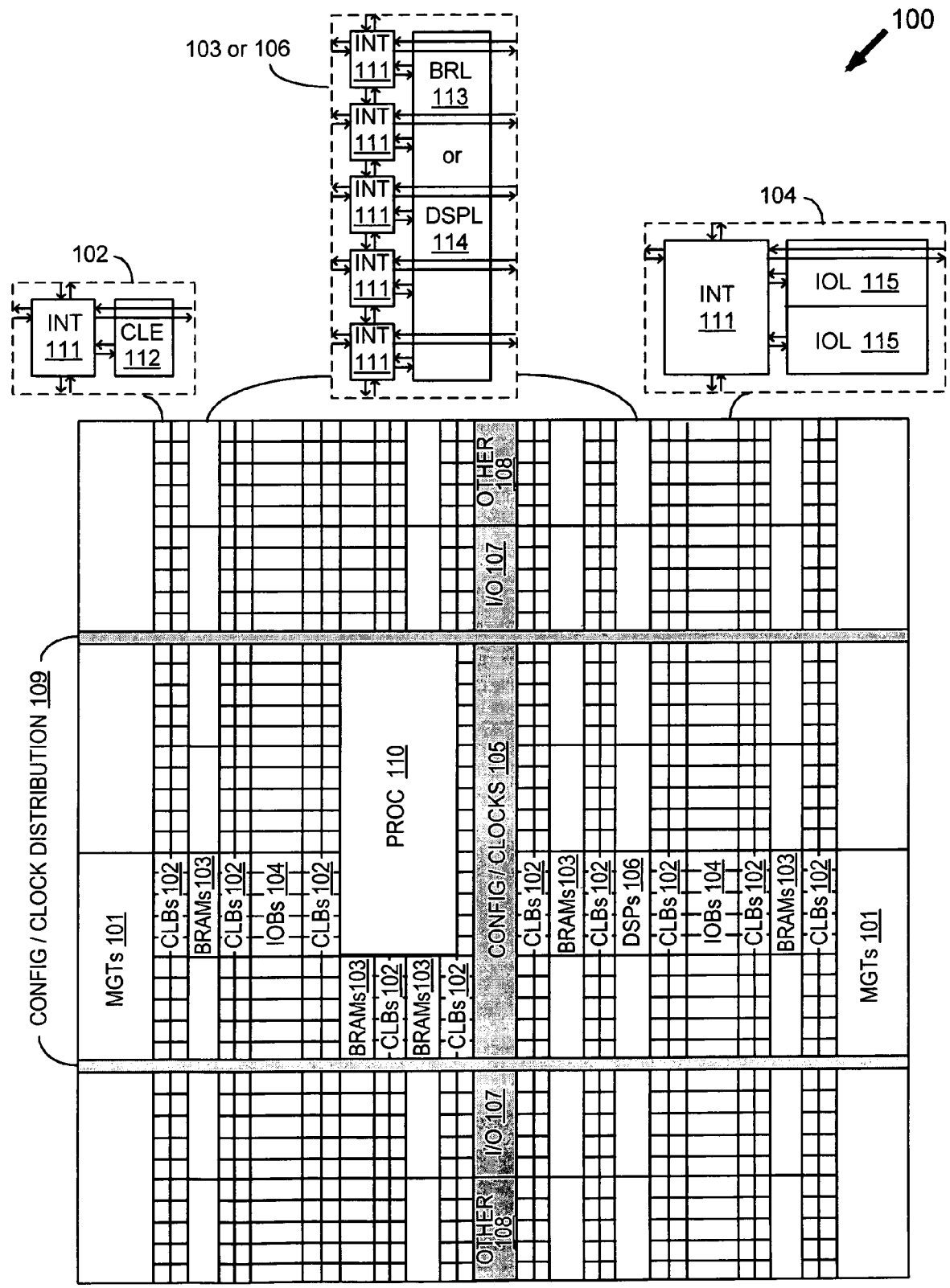
FIG. 1 illustrates an exemplary Field Programmable Gate Array (FPGA) architecture.

As noted above, advanced FPGAs can include several different types of programmable logic blocks in the array. For example, FIG. 1 illustrates an FPGA architecture 100 that includes a large number of different programmable tiles including multigigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. For example, the number of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs are typically included wherever the CLBs appear, to facilitate the efficient implementation of user logic, but the number of adjacent CLB columns varies with the overall size of the FPGA.

Figure 2:
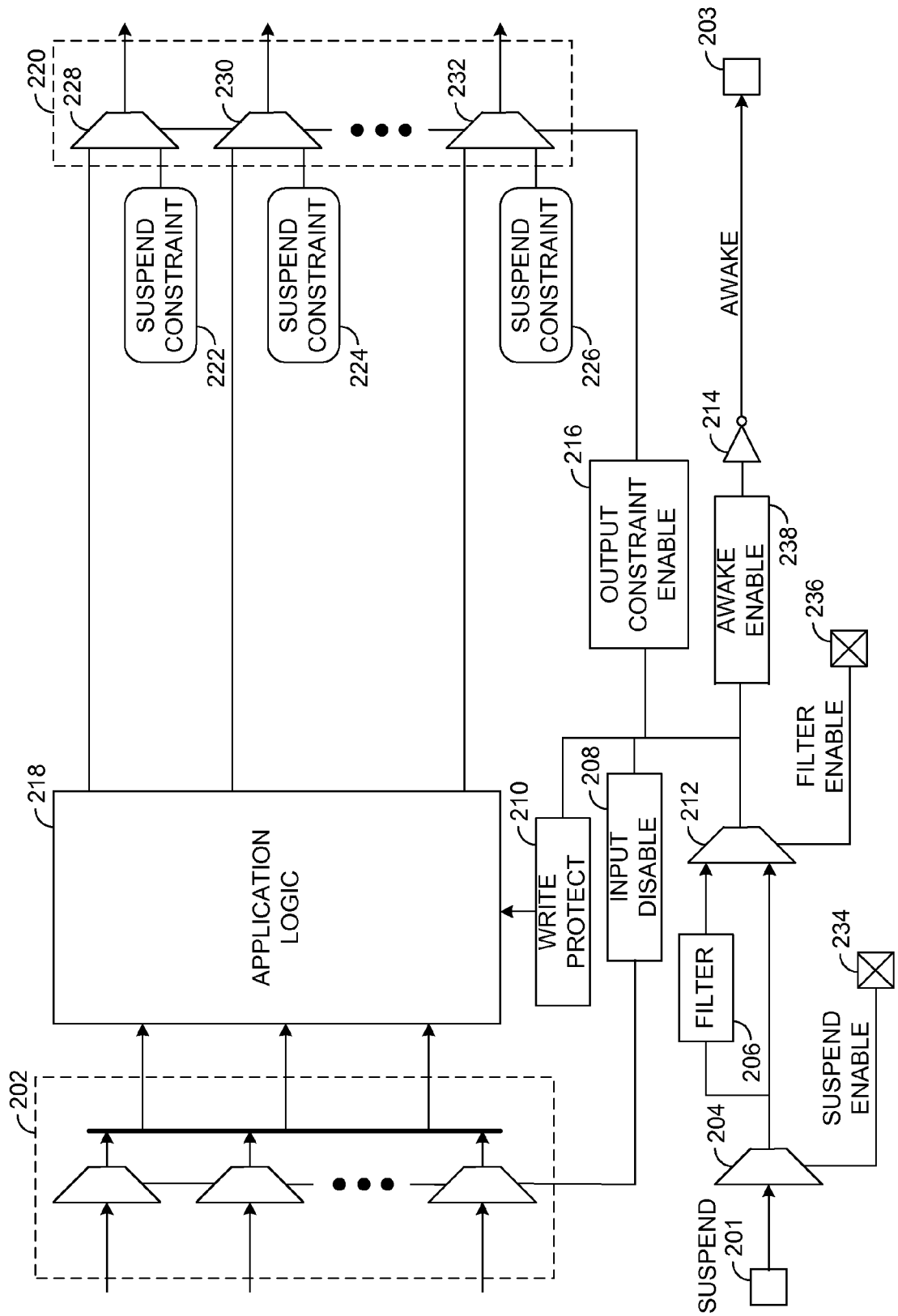
FIG. 2 illustrates an exemplary suspend mode block diagram contained within the FPGA of FIG. 1.

Turning to FIG. 2, an exemplary suspend mode block diagram is presented, whereby FPGA application logic and associated input/output blocks within an FPGA may be programmed to a low-power consumption state. The application implemented by application logic 218 is controlled by configuration data bits that are downloaded to the FPGA during a configuration event. The configuration data bits can be stored in volatile memory. e.g., static memory cells, in non-volatile memory, or in any other type of memory cell and may then be downloaded into the configuration memory space of the FPGA to define flip-flops, shift registers, BRAMs, look-up-table RAMs, latches, etc., within application logic block 218 to implement a particular logic application.

Signal SUSPEND may represent a signal that is asserted by an external source and received by one or more FPGAs within a particular system so as to cause entry of the suspend mode by one or more FPGAs. In particular, assertion of signal SUSPEND, via SUSPEND pin 201 in this embodiment, causes the FPGA to enter a low-power consumption state, whereby all non-essential FPGA functions are shut down to minimize power dissipation. In addition, writable clocked elements within application logic 218 are write protected, via write protect block 210, against spurious write operations. As discussed above, application logic 218 represents a logic resource within the FPGA that may contain flip-flops, shift registers, BRAMs, look-up-table RAMs, latches, etc., whereby any writable clocked elements within application logic 218 are prohibited from changing their respective logic states while the suspend mode is active.

In addition, input disable block 208 disables input/interconnect block 202 from accepting any new data during the suspend mode. Thus, by operation of write protect block 210 and input disable block 208, the application state of application logic 218 is forced to a static logic state during activation of suspend mode via assertion of signal SUSPEND. As discussed in more detail below, each of the outputs in output block 220 may also assume a predefined suspend mode behavior in response to the assertion of signal SUSPEND, whereby the suspend mode behavior is defined by suspend constraints 222-226 and are selected by output constraint enable block 216.

In operation, suspend mode is enabled by signal SUSPEND ENABLE via configuration memory cell 234, whereby the logic state-of configuration memory cell 234 is configured by downloading the appropriate configuration data bit into memory cell 234 during a configuration event. Once the logic level of signal SUSPEND ENABLE is configured, the select value of multiplexer 204 is selected to either allow signal SUSPEND to propagate to the input of multiplexer 212 and filter 206, or to disallow the propagation of signal SUSPEND.

If suspend mode is enabled, then signal SUSPEND is allowed to propagate and may be optionally filtered via filter 206 in accordance with the logic state of signal FILTER ENABLE as provided by configuration memory cell 236. In particular, the logic state of configuration memory cell 236 may be configured by downloading the appropriate configuration data bit into memory cell 234 during a configuration event. If filtering is enabled, for example, then the select input of multiplexer 212 is appropriately selected to allow filter 206 to provide signal SUSPEND to awake enable block 238 via multiplexer 212. Through filtration of signal SUSPEND, for example, any unintended transitions of the logic state of signal SUSPEND may be rejected to avoid entering the suspend mode due to a spurious condition. If signal SUSPEND is not to be filtered, on the other hand, then the select input of multiplexer 212 may be appropriately selected to allow multiplexer 204 to provide signal SUSPEND to awake enable block 238 via multiplexer 212, thus bypassing filter 206.

As discussed in more detail below, configuration data bits may be downloaded into the programmable logic device and stored within configuration memory cells to configure buffer 214 as either an active output driver, or an open-drain output driver. As an active output driver, awake enable block 238 provides the AWAKE signal to the input of buffer 214, which in turn actively drives an AWAKE pin of the PLD with signal AWAKE. In such an instance, other devices may monitor the potential of the AWAKE pin to determine the status of the suspend mode within the PLD. As an open-drain output driver, on the other hand, awake enable block 238 enables the output of buffer 214 using signal AWAKE to conduct current from the AWAKE pin. As such, multiple PLDs may be connected via their respective AWAKE pins, so as to implement a synchronized wake-up process, whereby until all PLDs have enabled their respective open-drain output drivers, all PLDs remain in their respective suspend modes.

Figure 3A:
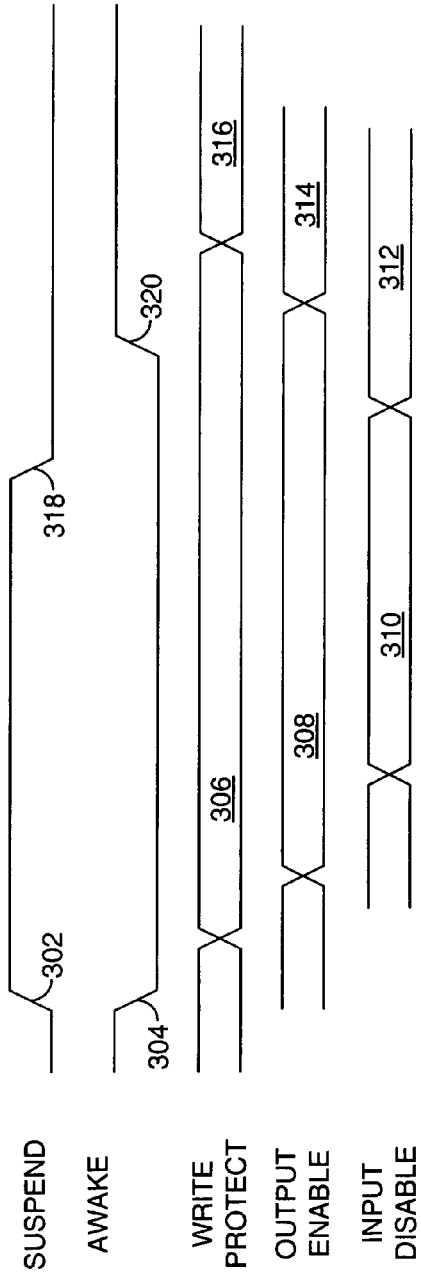
FIG. 3A illustrates an exemplary timing diagram for the suspend mode and wake-up sequences executed by the block diagram of FIG. 2.
Figure 3C:
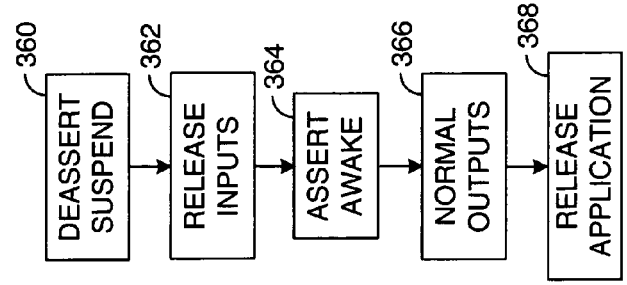
FIG. 3C illustrates an exemplary process flow diagram for the recovery from the suspend mode.
Figure 3B:
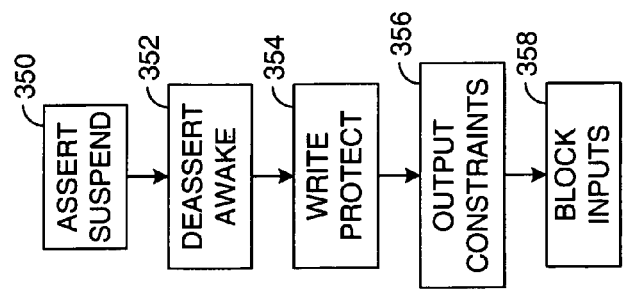
FIG. 3B illustrates an exemplary process flow diagram for entry into the suspend mode.

Turning to FIGS. 3A and 3B, timing and associated process flow diagrams are exemplified, in which the entry into suspend mode is illustrated. As discussed above in relation to FIG. 2, configuration data bits are downloaded into the PLD to allow activation of suspend mode via configuration memory cell 234 and multiplexer 204. In addition, configuration data bits are downloaded into the PLD to allow activation of filter 206 via configuration memory cell 236 and multiplexer 212.

Rising edge 302 may assert signal SUSPEND, as in step 350, to unconditionally force the FPGA into the suspend mode given that the suspend mode of the PLD has previously been activated. In step 352, signal AWAKE is deasserted by falling edge 304 to indicate that the FPGA is entering the suspend mode. As discussed above, signal AWAKE may be presented to an output pin of the FPGA, so as to facilitate the monitoring of the FPGA's suspend mode status by other devices (not shown) in FIG. 2. In response to the assertion of signal SUSPEND and after a configurable time delay, write protect block 210 write protects and preserves the states of all writable clocked elements within application logic 218 as in step 354. That is to say, in other words, that the logic states of all flip-flops, BRAMs, LUT RAMs, shift registers, I/O latches, etc., that may be implemented within application logic 218 are preserved for the duration of the suspend mode as indicated during write protect duration 306 of FIG. 3A.

TABLE 1

| SUSPEND ATTRIBUTE | FUNCTION |
| --- | --- |
| DRIVE_LAST_VALUE | The output continues to drive the level that was last latched by the output. |
| 3STATE | The output is in a high-impedance state. |
| 3STATE_PULLUP | The output is in a high-impedance state with an internal pull-up resistor. |
| 3STATE_PULLDOWN | The output is in a high-impedance state with an internal pull-down resistor. |

TABLE 1-continued

| SUSPEND ATTRIBUTE | FUNCTION |
|---|---|
| 3STATE-KEEPER | The output is in a high-impedance state. Valid logic levels are maintained by an internal bus keeper circuit without the need for pull-up or pull-down resistors. |

In step 356, output constraint enable 216 toggles the attribute of the outputs of output block 220 from their normal functions, as previously programmed during a configuration event, to one of the suspend attributes, as exemplified in Table 1, during time duration 308. If the DRIVE_LAST_VALUE attribute is selected, for example, each output of output block 220 may be latched and each output continues to drive the latched logic level. If the 3STATE attribute is selected, on the other hand, then each output of output block 220 may transition to a high-impedance state, which minimizes the current draw within output block 220. Conversely, if the 3STATE_PULLUP attribute is selected, then the output is placed into a high-impedance state with an internal pull-up resistor (not shown) connected to an associated I/O supply voltage. As such, the I/O supply voltage is prohibited from being disabled during the suspend mode, which results in an increased current draw within output block 220, as compared to the 3STATE attribute as discussed above.

The 3STATE_PULLDOWN attribute may instead be selected, which places the output into a high-impedance state with an internal pull-down resistor (not shown) connected to the associated I/O supply voltage reference. Alternately, the 3STATE_KEEPER attribute may be selected, which places the output into a high-impedance state, but does not require either a pull-up, or pull-down, resistor. Instead, an internal bus keeper circuit (not shown) maintains each output at a valid logic level while output block 220 is disabled during the suspend mode. After another configurable time delay, input disable 208 disables inputs/interconnects 202 in step 358 to prevent any internal switching activity during time duration 310.

Turning to FIGS. 3A and 3C, timing and associated process flow diagrams are exemplified, in which the recovery from suspend mode is illustrated. Falling edge 318 deasserts signal SUSPEND, as in step 360, causing the FPGA to begin recovery from the suspend mode. After another configurable time delay, input disable 208 enables inputs/interconnects 202 in step 362 to allow signals to propagate internally within the FPGA during time period 312. It is noted, that the application state of application logic 218, as protected in step 354 of FIG. 3B, remains protected since all writable clocked elements within application logic 218 remain write protected. After another configurable time delay, signal AWAKE is asserted in step 364 by rising edge 320 to indicate that the FPGA is exiting the suspend mode to begin the wake-up process. As discussed in more detail below, signal AWAKE may be presented to an output pin of the FPGA via an active output driver, so as to facilitate the monitoring of the FPGA's suspend mode status by other devices (not shown) in FIG. 2. Alternately, signal AWAKE may enable the output of an open-drain output driver so as to facilitate control of the wake-up process via an external device.

Subsequent to another configurable time delay, output constraint enable 216 toggles the suspend attribute of the outputs of output block 220 in step 366 from their previous suspend constraints, as programmed in step 356 of FIG. 3B, to their normal function as specified by application logic 218. In response to the assertion of signal AWAKE and after another configurable delay, write protect block 210 removes the write protection from all writable clocked elements within application logic 218 as in step 368. That is to say, in other words, that the logic states of all flip-flops, BRAMs, LUT RAMs, shift registers, I/O latches, etc., that may be implemented within application logic 218 are made to be writable once again during time duration 316.

It is noted that initiation of time duration 314 and the initiation of time duration 316 are completely independent and configurable. Once output block 220 is released, as in step 366, and the write protection from the writable clocked elements of application logic 218 is removed, as in step 368, the application within application logic 218 may proceed normally after the wake-up process has completed without the need to reconfigure application logic 218.

Figure 4B:
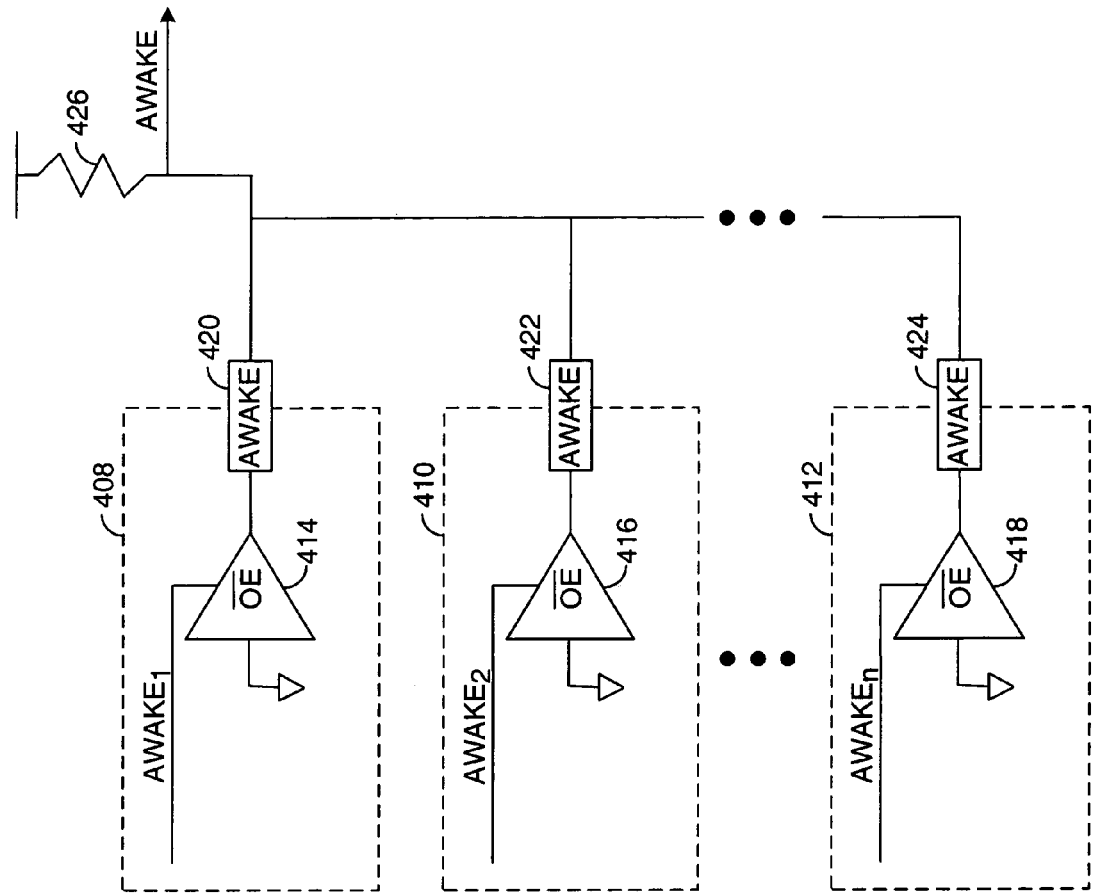
FIG. 4B illustrates an exemplary block diagram that facilitates synchronous operation of the suspend mode and suspend mode recovery sequences.
Figure 4A:
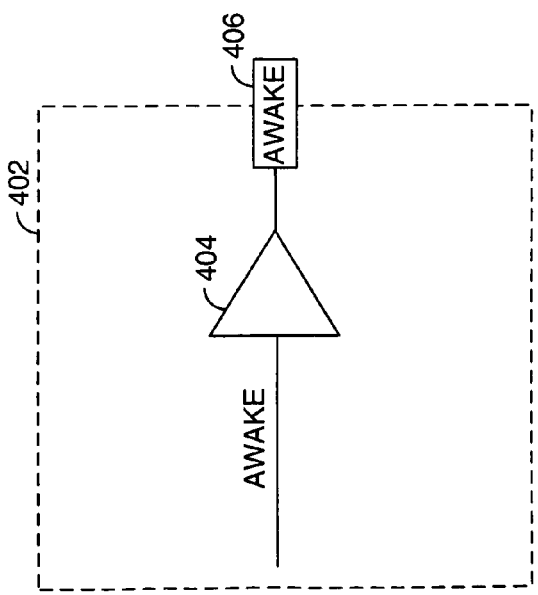
FIG. 4A illustrates an exemplary block diagram of an active output driver to provide the suspend mode status.

As discussed above, the AWAKE signal may be generated internally by an active output driver, or conversely, may be facilitated by an open-drain output driver that is capable of sinking current generated from an external source. Turning to FIGS. 4A and 4B, exemplary block diagrams illustrating both implementations are presented. FIG. 4A exemplifies a first embodiment, whereby signal AWAKE may be internally generated within FPGA 402 and then received by active output driver 404 previously configured during a configuration event. As such, signal AWAKE is itself buffered and then directly applied to AWAKE pin 406 of FPGA 402. Other devices (not shown) may then monitor the logic state of AWAKE pin 406 in order to determine the status of FPGA 402 as it relates to the suspend mode of FPGA 402. If the logic state present at AWAKE pin 406 is a logic high, for example, then as exemplified in FIG. 3A, FPGA 402 is not in the suspend mode. If, on the other hand, the logic state present at AWAKE pin 406 is a logic low, then FPGA 402 is in the suspend mode.

FIG. 4B exemplifies an alternate embodiment, whereby the suspend mode and wake-up process, i.e., suspend mode recovery, of multiple FPGAs 408-412 may be synchronized through the use of an external signal as provided through pull-up resistor 426. In operation, open-drain drivers 414-418, previously configured during a configuration event, allow a current path to exist between AWAKE pins 420-424 and a reference potential, e.g., ground potential, when the respective outputs of open-drain drivers 414-418 are enabled via internally generated signals $AWAKE_1$-$AWAKE_n$, respectively.

Given that FPGA 408, for example, begins the process to exit suspend mode, as discussed above in relation to FIGS. 3A and 3C, signal $AWAKE_1$ is asserted, thus disabling the output of open-drain driver 414. Once disabled, a current path no longer exists through pull-up resistor 426, AWAKE pin 420, and open-drain driver 414 within FPGA 408. However, given that FPGAs 410-412 have not yet begun the process to exit the suspend mode, open-drain drivers 416-418 remain conductive, thus conducting adequate drive current to maintain a logic low potential on AWAKE pins 420-424. As such, even though FGPA 408 has requested to exit suspend mode via assertion of signal $AWAKE_1$, the lack of a request to exit suspend mode within FPGAs 410-412 prevents FPGA 408 from exiting the suspend mode.

Once each of FPGAs 410-412 have begun their respective processes to exit suspend mode, as discussed above in relation to FIGS. 3A and 3C, the outputs of open-drain drivers 416-418 are disabled by the assertion of signals $AWAKE_2$-$AWAKE_n$. As such, a current path no longer exists through pull-up resistor 426, AWAKE pins 422-424, and open-drain drivers 416-418 within FPGAs 410-412, respectively, thus allowing pull-up resistor 426 to maintain a logic high potential on each of AWAKE pins 420-424. Thus, any of FPGAs 408-412 may not exit the suspend mode until each of FPGAs 408-412 have exited their respective suspend modes. In such an instance, a synchronized wake-up process is facilitated, whereby the suspend mode may be simultaneously exited by each of FPGAs 408-412 only after each of FPGAs 408-412 have asserted their respective AWAKE signals.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. An integrated circuit device, comprising:
   an application logic block coupled to receive configuration data bits and adapted to implement a logic application in response to the configuration data bits;
   a suspend pin coupled to receive a suspend signal;
   a write protect block coupled to the application logic block and adapted to prohibit the application logic block from changing logic states in response to a suspend mode initiated by the suspend signal;
   an awake pin adapted to provide an awake signal that is indicative of a status of the suspend mode; and
   a first multiplexer coupled to receive the suspend signal and adapted to allow propagation of the suspend signal within the integrated circuit device in response to a first logic state of a suspend enable signal.

2. The integrated circuit device of claim 1, wherein the application logic block comprises writable clocked elements that are disabled in response to the suspend signal, wherein the logic application is preserved during the suspend mode.

3. The integrated circuit device of claim 2, wherein the writable clocked elements are enabled in response to the awake signal.

4. The integrated circuit device of claim 1, wherein the first multiplexer is adapted to disallow propagation of the suspend signal within the programmable logic device in response to a second logic state of the suspend enable signal.

5. The integrated circuit device of claim 4, further comprising a filter coupled to the first multiplexer and adapted to provide a filtered suspend signal to prohibit an unintended initiation of the suspend mode within the programmable logic device.

6. The integrated circuit device of claim 5, further comprising a second multiplexer having an input coupled to the filter and adapted to allow propagation of the filtered suspend signal within the programmable logic device in response to a first logic state of a filter enable signal.

7. The integrated circuit device of claim 6, wherein the second multiplexer is adapted to disallow propagation of the filtered suspend signal within the programmable logic device in response to a second logic state of the filter enable signal.

8. The integrated circuit device of claim 1, further comprising an input block coupled to the application logic block, the input block being prohibited from providing inputs to the application logic block in response to the suspend mode.

9. The integrated circuit device of claim 1, further comprising an output block coupled to the application logic block, the output block being prohibited from accepting outputs from the application logic block in response to the suspend mode.

10. The integrated circuit device of claim 1, further comprising a configurable output driver having an output coupled to the awake pin and an output enable coupled to receive the awake signal, the output driver being configured to conduct current from the awake pin in response to a first logic state of the awake signal.

11. The integrated circuit device of claim 1, further comprising a configurable output driver having an output coupled to the awake pin and an input coupled to receive the awake signal, the output driver being configured to provide the awake signal to the awake pin.

12. A method of implementing configurable power management within an integrated circuit, the method comprising:
    configuring an application logic block within the integrated circuit to execute a logic application;
    activating a suspend mode within the integrated circuit;
    suspending operation of the application logic block while the suspend mode is active, wherein the configuration and application state of the application logic block is preserved during the suspend mode; and
    configuring an output driver of the integrated circuit to allow deactivation of the suspend mode, wherein operation of the application logic block is resumed in response to the deactivated suspend mode without requiring a reconfiguration of the application logic block.

13. The method of claim 12, wherein activating the suspend mode comprises:
    downloading configuration data bits to the integrated circuit; and
    storing the configuration data bits within configuration memory cells to configure the integrated circuit to initiate the suspend mode in response to a suspend signal.

14. The method of claim 12, wherein suspending operation of the application logic block comprises preventing elements within the application logic block from changing logic states.

15. The method of claim 12, further comprising:
    disabling an input block of the integrated circuit in response to the suspend mode; and
    disabling an output block of the integrated circuit in response to the suspend mode.

16. The method of claim 12, wherein configuring the output driver comprises:
    downloading configuration data bits to the integrated circuit;
    storing the configuration data bits within configuration memory cells to configure the output driver as an active output driver; and
    providing an awake signal to an output pin of the integrated circuit using the output driver to initiate a wake-up process in response to the deactivated suspend mode.

17. The method of claim 12, wherein configuring the output driver comprises:
    downloading configuration data bits to the integrated circuit;
    storing the configuration data bits within configuration memory cells to configure the output driver as an open-drain output driver; and
    providing an awake signal to enable an output of the open-drain output driver to allow a device external to the integrated circuit to initiate a wake-up process in response to the deactivated suspend mode.

18. A configurable power management system, comprising:
    a plurality of programmable logic devices coupled together at a first node, each programmable logic device including,
    an application logic block coupled to receive configuration data bits and adapted to implement a logic application in response to the configuration data bits;
    a suspend pin coupled to receive a suspend signal;

a write protect block coupled to the application block and adapted to prohibit the application block from changing logic states in response to a suspend mode initiated by the suspend signal;

an output driver coupled to receive an awake signal from within the programmable logic device, wherein an output of the output driver is disabled in response to the awake signal; and an awake pin coupled to the output of the output driver; and an external device coupled to the first node, the external device adapted to assert a logic level at the first node to allow the plurality of programmable logic devices to synchronously recover from the suspend mode after each output driver of each programmable logic device is disabled.

19. The configurable power management system of claim 18, wherein the external device includes a resistor having a first conductor coupled to the first node and a second conductor coupled to a power supply.

* * * * *